United States Patent [19]
Åman

[11] 3,976,972
[45] Aug. 24, 1976

[54] PREVENTION OF NON-ALLOWED CHARACTER COMBINATIONS

[75] Inventor: Kurt Arvid Åman, Johanneshov, Sweden

[73] Assignee: Telefonaktiebolaget L M Ericsson, Stockholm, Sweden

[22] Filed: Feb. 24, 1975

[21] Appl. No.: 552,773

Related U.S. Application Data

[63] Continuation of Ser. No. 417,814, Nov. 21, 1973, abandoned.

[30] Foreign Application Priority Data
Dec. 14, 1972 Sweden..........................7216319

[52] U.S. Cl..................................... 340/146.1 AB
[51] Int. Cl.$^2$........................................ G06F 11/12
[58] Field of Search .............. 340/146.1, 146.1 AB, 340/146.1 R; 178/23 A

[56] References Cited
UNITED STATES PATENTS

| | | | |
|---|---|---|---|
| 3,038,961 | 6/1962 | Walker et al. | 178/23 A |
| 3,412,380 | 11/1968 | Heller et al. | 340/146.1 AB |
| 3,688,261 | 8/1972 | Henderson | 340/146.1 AB |

Primary Examiner—Charles E. Atkinson
Attorney, Agent, or Firm—Hane, Baxley & Spiecens

[57] ABSTRACT

A method is disclosed to prevent the transmission of non-allowed character combinations of signal elements which have for example, a route administrating or a control function. In the sender a sequence of the information carrying signal elements is formed. The sequence is divided into parts each including N-n signal elements. New character signals are formed by completing each of such parts with n signal elements, selected in such manner that only characters which are allowed are formed and the formed characters are transmitted to the receiver. In the receiver such parts including N-n signal elements are restored by removing the n signal elements for each character signal. Then a sequence of the original information carrying signal elements is formed and the last mentioned sequence of signal elements is divided in the original character signals consisting of N information elements.

2 Claims, 6 Drawing Figures

PREVENTION OF NON-ALLOWED CHARACTER COMBINATIONS

This is a continuation of application Ser. No. 417,814, filed Nov. 21, 1973 and now abandoned.

The present invention refers to a method and an arrangement for preventing during the transmission of information divided in character signals each including N information carrying signal elements the occurence of certain definite not allowed characters of character combinations.

In, for example, teletype and data transmission information is transmitted as character signals comprising five, six or seven information carrying bits. Some of such characters or character combinations have a route administrating function. In teletyping for example, the character combination ZCZC implies that the next following text should be interpreted as address information and the character combination NNNN implies that the communication is terminated so that the connection is automatically interrupted. In data transmission with seven-unit code (CCITT alphabet No. 5) single character signals have a corresponding function.

In certain cases it is required that a text should be spelled and in such cases the text should only include character signals, i.e. not control characters which correspond to the instructions "carriage return", "new line", "character shifting", "digit shifting" and so on.

In certain cases it may be necessary to transmit through the teleprinter connection such binary information which when divided into characters for the transmission may cause in a random manner route administrating characters or character combinations causing, for example, the automatic disconnection of the call during the transmission of a message. Such a binary information may consist of for example binary coded analog values.

In order to take into consideration all such cases it has been necessary in earlier solutions to replace, in the sender, such random occurring "not character" signals with other character combinations, e.g. double characters. In the receiver it has then been necessary to convert such double characters to the original single characters.

An equipment for such character conversion has been relatively complicated and expensive. Furthermore, a random varying processing speed for the supplied information has been obtained. This drawback has also implied that in order to consider random cases with a great number of double characters near to each other it has been necessary to over-dimension the intermediate memory which is necessary for the transmission, in order to obtain security.

The method and the arrangement according to the invention are characterized as appears from the accompanying claims.

The invention will be described here below by means of several embodiments which are to read along with the accompanying drawing in which.

Figures 1, 6:
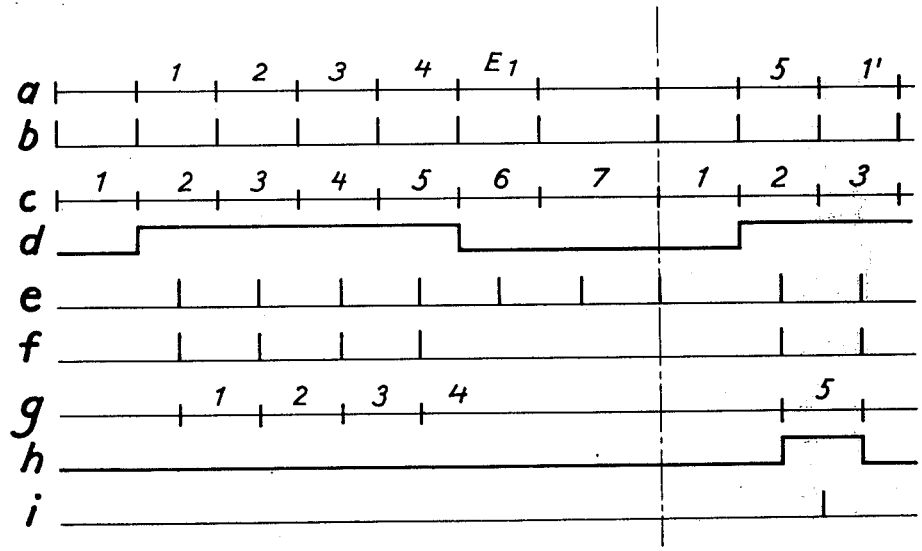
FIG. 1 shows the fundamental idea of the invention by means of binary series of signal elements.
FIG. 6 shows the series of signal elements upon climination of the start signal and the stop signal.

Line $a$ in FIG. 1 shows a series of sequential characters, according to CCITT, alphabet No. 2, in which each character is represented by 5 information carrying bits. Upon transmission of a signal element series consisting of random varying "one"-s and "zero"-s, e.g. in transmitting a measuring result or tables of figures, it may happen that such signal element combinations occur, which cause for example an unwanted carriage return or an unwanted space. In order to prevent the occurence of such unwanted character combinations, according to the invention the binary signal elements are combined in groups (1, 2, 3 and so on) with 4 bits per group as shown on line $b$ in FIG. 1. After each 4-group a space is left for an extra bit, which should be added in order to form according to line $c$ new 5-bit groups which will be transmitted. Such groups obtain now a quite different significance in the teletyping compared with the original significance as shown on line $d$ in FIG. 1.

By selecting the extra bit added to each four-group as 1 or 0 it is possible to determine which character should be allowed to occur in the transmitted text. The following table shows an example of some characters, which are not allowed to occur in ramdon combinations.

| | |
|---|---|
| 0 0 0 1 0 | Carriage return |
| 0 1 0 0 0 | New line |
| 1 1 1 1 1 | Character shifting |
| 1 1 0 1 1 | Number shifting |
| 0 0 1 0 0 | Space |
| 0 0 0 0 0 | Character No. 32 |

Suppose that the extra bit is placed at the end of a group as shown in FIG. 1. If now said extra bit in for example the alphabet No. is is selected to be 1, except when the bits 1, 2, 4 and 1, the above mentioned characters carriage return, new line, character shifting, number sifting, space, character No. 32 can never occur during transmission. Furthermore, the other characters, the last bit of which is o, will also not occur in transmission. Among said characters are the characters N and C, so that the character combinations ZCZC and NNNN (the text should be interpreted as address information and as end of the communication respectively) can never occur in a random manner.

In the receiver each fifth bit is suppressed as shown on line $e$ in FIG. 1. The binary series obtained in this manner is divided in groups of five bits according to line $f$ in FIG. 1 so that the original pulse series is restored.

The extra bit added in the sender has been placed after the four-group, but it could of course as well be placed before it or inserted between the bits in the 4-group, in which case the criterium that the extra bit should be 1 or 0 is selected in such manner that unwanted characters cannot occur during transmission.

The described method may be used as well with other character lengths than five bits. In for example the CCITT-code, No. 5, which includes seven information carrying bits, the bit flow in the sender is divided in groups of six bits and an extra seventh bit is added and removed in the receiver.

Fundamentally it is possible to carry out a division in groups of N-n bits in the sender, where N is the normal length of a character signal and n can be an arbitrary number less than N. Generally, however, n may be equal to 1.

In a message of course the beginning and the end may be transmitted directly, while only part of the communication is treated according to the method described.

Figure 2:
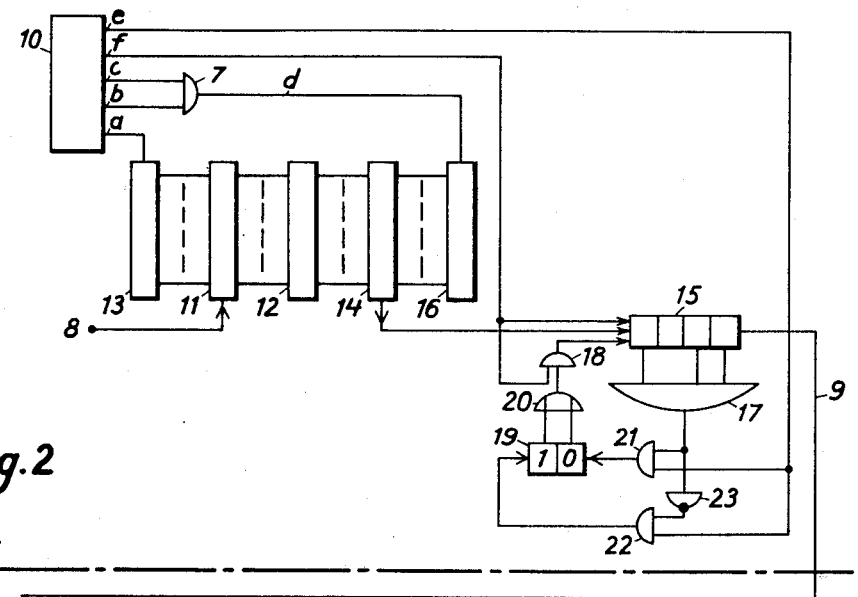
FIG. 2 shows a transmission arrangement comprising a sender and a receiver for carrying out the method according to the invention.

FIG. 2 shows an arrangement for carrying out the method according to the invention, the function of which will be explained with reference to FIGS. 3 and 4. By S is designated the sender in which the incoming signals are supplied from the input 8 to an intermediate memory 12 through gates 11, which are controlled by a position counter 13. The time of stepping forward in the position counter 13 corresponds to the rate at which the data pulses appears on line a in FIG. 3. The gates 11 are controlled in such manner that the first data bit is supplied to the first position in the intermediate memory, the second data bit to the second position and so on, until the intermediate memory, which according to the example has four positions, has been filled completely, after which the position counter 13 is restored to its starting position and the loading begins again with the first position.

The unloading of the data bits from the intermediate memory 12 is carried out by means of the gate 14 controlled by a second position counter 16 whose stepping forward rate is 5/4 times greater than the stepping forward rate of the position counter 13. The stepping forward pulses for both position counters are obtained from a clock generator 10 in which an output a generates pulses corresponding to the rate of the incoming data pulses according to line a in FIG. 3. The output b produces series of pulses according to line b in FIG. 3, the rate of which is 5/4 greater than the rate of pulses at the output a, and on an output c a pulse shaped signal is produced, which occurs during each fifth output pulse at the output b and has a duration of approximately one pulse length according to line c in FIG. 3. The signals b and c are supplied to inputs of an AND-gate 7, at the output of which a series of pulses is obtained according to line d in FIG. 3. This series corresponds to the pulse series b, but here each fifth b-pulse has been suppressed.

The data bits read out from the intermediate memory 12 are supplied to a shift register 15 which according to the example has four positions. According to the principle of the invention the character signals should be changed in such manner that the character signals mentioned in the introduction, e.g. carriage return, character shifting, should not have the possibility to occur as a consequence of the transmission of a random binary series. It appears that of the six characters, mentioned in the introduction, two are terminated by 1, while the other four are terminated by 0. Thus when replacing the fifth bit in the characters by 1 and 0 respectively in the transmission there is no danger that an unwanted character signal occurs. It appears that the two characters terminated by 1 both have a 1 in the first, second and fourth position, whereas the other characters terminated by 0 do not fulfil this condition.

In order to determine whether 1 or 0 should be added to the four bits recorded in the shift register there is an AND-gate 17 having three inputs connected to the first, second and fourth position in the shift register. The AND-gate 17 produces a 1-signal in the case when each of these positions contain 1, i.e. a character signal implying character shifting or number shifting should be transmitted (see the table above) if the subsequent signal element should be 1 while it does not produce any output signal if said condition is not fulfiled, i.e. if a randomly occuring 0 would cause transmission of an unwanted character signal. The feeding out of this 1 or 0 depending on the contents of the shift register 15 is carried out serially in such a manner that a 1 or o, depending on the condition of a bistable flip-flop, is supplied to the last position of the shift register and is shifted out together with the recorded four bits to the conductor 9. The bistable flip-flop 19 is set to 0 or 1 position respectively depending on the output signal from the AND-gate 17, which is supplied to one of the inputs of an AND-gate 21, the output signal of which sets the bistable flip-flop to 0-position or through an inverting gate 23 to one of the inputs of an AND-gate 22, the output signal of which sets the bistable flip-flop 19 to 1-position. The other input of the AND-gates 21 and 22 obtains an input signal from the clock generator 21 according to line e in FIG. 3, which signal occurs at the time when four data pulses have been reliably supplied to the shift register 15, but sufficiently early in order to allow the flip-flop 19 to be already set depending on the output signals from the AND-gate 17 when the shifting out of a four-group recorded in the shift register begins. The stepping forward of the shift register 15 and the reading out of the condition of the flip-flop 19 through the AND-gate 18 to the first stage of the shift register is carried out by means of pulses from the clock generator according to line f in FIG. 3, from which it appears that the four first data pulses are transmitted without change, but they are followed by an extra bit $E_1$. After this the four subsequent data pulses will be followed by an extra bit $E_2$ and so on. The rate will be 5/4 of the velocity of the data signal fed in.

Figure 4:
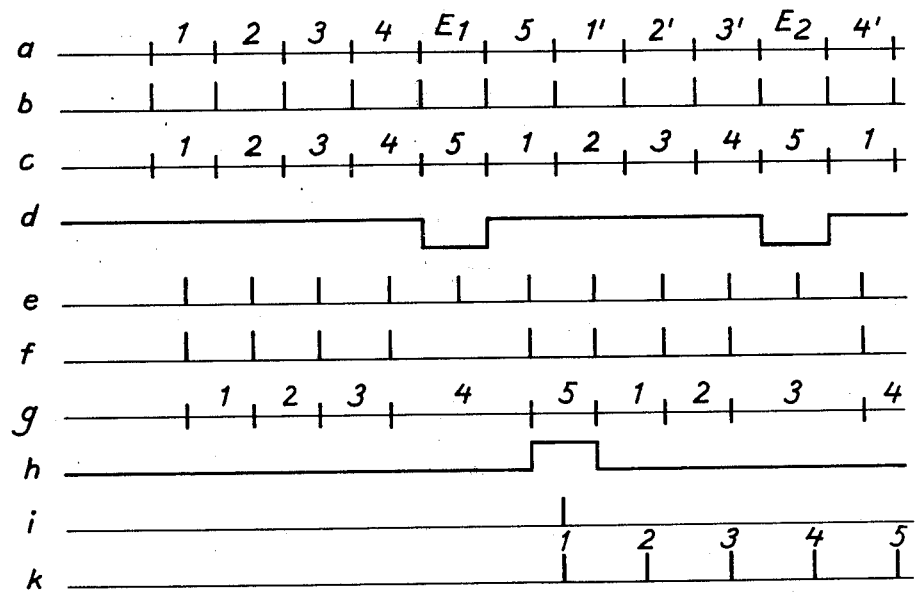
FIG. 4 shows the series of signal elements at different points of the receiver.

In the receiver the incoming data pulses are supplied to a five-positions shift register 30 according to line a in FIG. 4. A clock pulse generator 24 produces a series of stepping pulses according to line b in FIG. 4, the first pulse of which arrives simultaneously with the leading edge of the first data pulse. The series of stepping pulses b is supplied to a first counter 25, which has five stages, e.g. a ring counter having five stages. The output signal of the counter 25 is positive except when the counter is in position 5 according to line d in, FIG. 4. The output signal on line d is supplied to one of the inputs of an AND-gate 26 to the other input of which a pulse series is supplied from the clock pulse generator 24 according to line e in FIG. 4, which pulse series has the same pulse frequency as the pulse series b but displaced approximately a half pulse position. The output of the AND-gate 26 produces consequently a pulse series according to line f in FIG. 4, in which series each fifth pulse is suppressed. The pulses are supplied as stepping pulses to a second counter 27 which is a ring count having five stages. It is stepped forward one stage for each of the incoming data pulses, but not by the extra pulses $E_1$, $E_2$ and so on as the output pulse from the AND-gate 26 is inhibited during said pulses according to line f in FIG. 4. Upon each stepping forward counter 27 supplies a stepping pulse to a shift register 30 to which shift register also the incoming data pulses are supplied. When the shift register 30 is shifted by means of the stepping pulses from the counter 27 consequently no shifting is carried out during extra pulses $E_1$, $E_2$ and so on, so that said pulses disappear. Only the data pulse following after the extra pulse can be supplied to the shift register as it appears from line *g* in FIG. 4. The shift register 30 will consequently contain a five-group in its original form. The counter 27 supplies in its position 5 an output pulse to one of the inputs of an AND-gate 28 according to line *b* in FIG. 4. The other input of the AND-gate 28 obtains the pulse series in accordance with line *b* in FIG. 4 so that from the output of the AND-gate 28 a pulse according to line *i* in FIG. 4 is obtained. Said pulse is used for controlling a gating means 29, which transmits the contents of the shift register 30 in parallel form to a register 31 of five stages, from which it can be fed out in serial form in known manner according to line *k* in FIG. 4.

Figure 5:
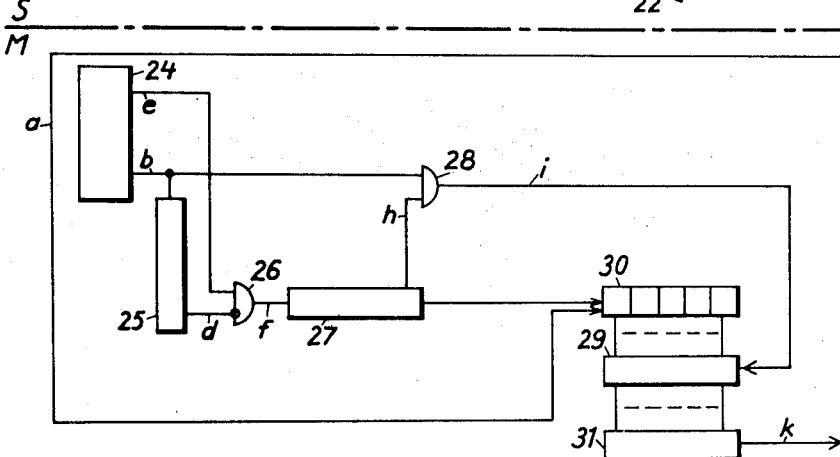
FIG. 5 shows the series of signal elements in another embodiment of the invention.
Figure 5:
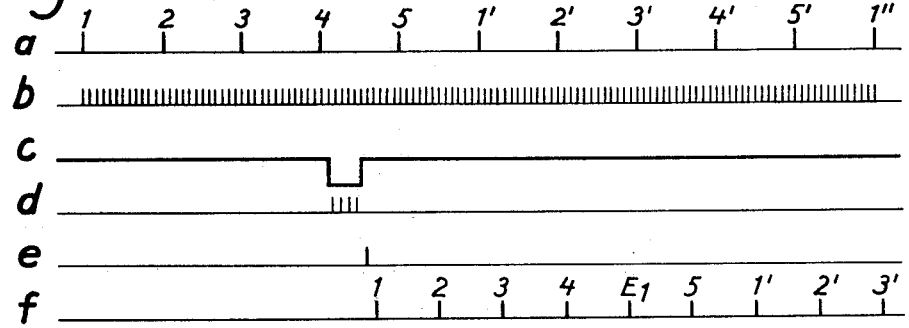

FIG. 5 shows an alternative embodiment for supplying the data pulses from the intermediate memory 12 to the shift register 15 in FIG. 2. In this case the pulses *b* consist of a pulse series having such a high pulse frequency that transmission of the pulses in serial form would be possible during part of a data pulse period.

Normally the output of the AND-gate 7 is blocked except during a short period after receiving the four first data pulses according to line *c* in FIG. 5 so that 4 stepping pulses according to line *d* in FIG. 5 are supplied to the position counter 16, and the four data pulses which have been recorded first in the intermediate memory are fed out rapidly after each other to the shift register 15. A test pulse *e* which occurs as the fifth pulse after the four pulses according to line *d* sets the flip-flop 19 to 0 or 1 position in the same manner as explained above. After this the shift register 15 is stepped forward by stepping pulses the velocity of which is 5/4 of the velocity of the data signal fed in according to line *f* in FIG. 5 which also shows the data pulses supplied to the output of the shift register and consequently to the transmission line.

Figure 3:
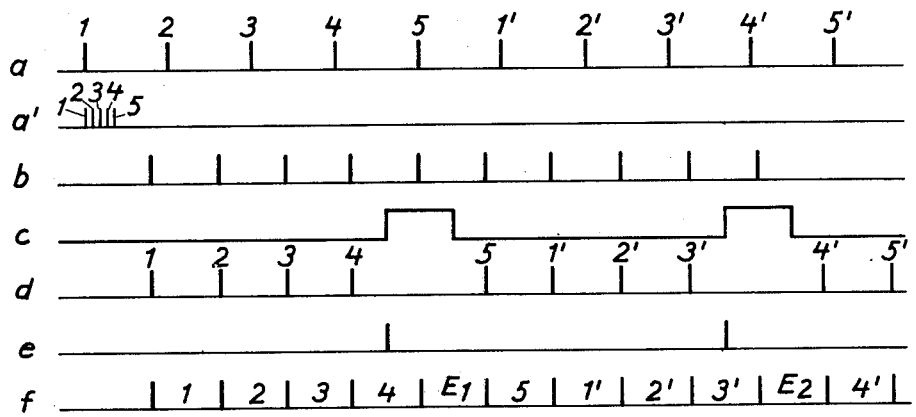
FIG. 3 shows the series of signal elements in the sender at different points of the sending arangement.

A further alternative method for recording the data signals coming to the sender in the intermediate memory 12 consists therein that the signals which are supposed to be available in parallel form are supplied to the intermediate memory through a gate arrangement not shown in the figure by means of fast stepping pulses according to line *a* in FIG. 3. The recording pulses have such a high frequency that the writing in of a five-group can be carried out between two reading out points. Feeding out of the pulses to the output of the arrangement can be carried out in the same manner as earlier described with reference to FIG. 3 or FIG. 5.

In all the examples described the data rate at the output of the sender has been 5/4 of the data rate at the input of the sender. In certain cases, however, the feeding in and feeding out rate can be locked at the same value, e.g. in the case when the input and output means consist of a tape reader and a tape punch respectively driven by the same motor.

In this case the arrangement operates in the same manner as described in connecton with FIG. 3 and 4 and the only difference will be that since the feeding in and feeding out velocity is the same, the intermediate memory has to be increased when the output signals are completed with an extra data pulse E. For each character of five data pulses which is fed in, 4 data pulses plus one extra data pulse are fed out and consequently the memory has to contain as many positions as correspond to the maximum number of characters fed in during a communication.

In a start-stop system in which each character is preceded by a start pulse and, folowed by a stop pulse only the information carrying pulses are supplied to the intermediate memory. In feeding out the signals from the sender, at first a new start character signal is produced and sent out after which 4 information carrying pulses are sent out together with the extra pulse E previously mentioned, whereupon a stop pulse is generated and sent out. The methods described here above may also be used here, but a time must be available for the start, and stop pulses and the clock pulse generator has to be dimensioned for this purpose. A shift register 15 can for example be built with seven positions of which the first always corresponds to a start pulse and the last always corresponds to a stop pulse.

FIG. 6 shows how the arrangement according to FIG. 2 can be used in order to eliminate in the receiver not only the extra data pulses $E_1$, $E_2$ and so on, but also the start and stop pulses. Line *a* in FIG. 6 shows incoming signals having start-stop signals in series form. A stepping pulse series according to line *b* in FIG. 6 having a stepping pulse at the beginning of each incoming data pulse steps forward the counter 25, which in this case consists of a seven-stage counter, e.g. a ring counter. The count position of the counter appears from line *c* in FIG. 6. The counter produces a positive output when its counting position is 1,6 and 7 and in this position the AND-gate 26 is blocking, while during the pulse positions 2, 3, 4, 5 the AND-gate 26 is open so that the pulses E can pass as appears from line d, e and f respectively in FIG. 6. The output of the AND-gate 26 steps forward the counter 27 which is a five-stage counter as explained in connection with FIG. 2. It is stepped forward only in the signal positions 1, 2, 3 and 4 and consequently it comes to its position 5 during the first position of the subsequent character signal as it appears from line *g* in FIG. 6. In this manner the start and stop signals as well as the extra pulse E disapper. In the same manner as explained in connection with FIG. 4, position 5 of the counter 27 produces an output *h* which is supplied as one of the inputs of the AND-gate 28 the second input of which consists of the pulse series b. The output signal *i* of the AND-gate 28 is used for controlling the gate circuits 29 which transmits in parallel form 5 data pulses recorded in the shift register 30, to the register 31 from which the original character can be read out in series or in parallel form in known manner.

We claim:

1. In an information system for serially transferring characters, wherein each character is represented by a coded combination of N signal elements which are transmitted serially in a single channel, a method of encoding characters to be transmitted so that nonallowable groups of N sequential signal elements are not transmitted comprising the steps of serially generating characters represented by groups of N signal elements, serially arraying the generated characters into a stream of the signal elements, sequentially selecting each N-n of the signal elements of the stream without exception to form partial character groups of signal elements so that every signal element is in one of the partial character groups and some of the signal elements of a generated character are in one of the partial character groups and the remainder of the signal elements of the generated character are in an adjacent partial character group, and inserting into each partial character group n signal elements to form transmittable character groups, said n signal elements being selected so that the combination of signal elements of each transmittable character group represents only an allowable character.

2. Apparatus for encoding and transmitting characters so that only allowable character combinations represented by coded combinations of N signal elements which represent binary information will be transmitted comprising: a source of serially generated groups of N-n signal elements, said source comprising means for generating characters represented by sets of N signal elements, means for serially arraying said sets of N signal elements, and means for separating the signal elements in the serial array into groups of N-n signal elements wherein every signal element is in one of said groups and some of the signal elements of each set is one of said groups and the remainder of the signal elements of the set are in another of said groups; storing means for sequentially storing each group of N-n signal elements; logic means connected to said storing means for generating n signal elements for each stored group of N-n signal elements, the n signal elements being chosen so that said n signal elements and the N-n signal elements of the associated group form a group of N signal elements representing only an allowable character; and means connected to said storing means and said logic means for sequentially transmitting each group of N-n signal elements in sequence with its associated n signal elements generated by said logic means.

* * * * *